United States Patent
Agarwal et al.

(10) Patent No.: US 8,438,003 B2
(45) Date of Patent: May 7, 2013

(54) METHODS FOR IMPROVED SIMULATION OF INTEGRATED CIRCUIT DESIGNS

(75) Inventors: Rakesh Agarwal, Palo Alto, CA (US); Oana Baltaretu, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 936 days.

(21) Appl. No.: 12/082,971

(22) Filed: Apr. 14, 2008

(65) Prior Publication Data

US 2009/0037161 A1 Feb. 5, 2009

Related U.S. Application Data

(60) Provisional application No. 60/923,389, filed on Apr. 12, 2007.

(51) Int. Cl.
*G06F 17/50* (2006.01)

(52) U.S. Cl.
USPC .......... 703/17; 711/3; 711/122; 711/140; 711/144; 718/104

(58) Field of Classification Search .......... 703/17; 711/3, 122, 137, 140, 144; 718/104
See application file for complete search history.

(56) References Cited

U.S. PATENT DOCUMENTS

| | | | | |
|---|---|---|---|---|
| 4,654,791 A | * | 3/1987 | Ushiro | 710/3 |
| 5,305,389 A | * | 4/1994 | Palmer | 382/305 |
| 5,339,420 A | * | 8/1994 | Hoxey | 717/151 |
| 5,509,135 A | * | 4/1996 | Steely, Jr. | 711/147 |
| 5,584,013 A | * | 12/1996 | Cheong et al. | 711/122 |
| 5,592,634 A | * | 1/1997 | Circello et al. | 712/239 |
| 5,606,683 A | * | 2/1997 | Riordan | 711/207 |
| 5,627,994 A | * | 5/1997 | Levy et al. | 711/150 |
| 5,642,493 A | * | 6/1997 | Burgess | 711/116 |
| 5,669,001 A | * | 9/1997 | Moreno | 717/149 |
| 5,721,854 A | * | 2/1998 | Ebcioglu et al. | 712/203 |
| 5,749,094 A | * | 5/1998 | Jaggar | 711/139 |
| 5,778,436 A | * | 7/1998 | Kedem et al. | 711/137 |
| 5,896,517 A | * | 4/1999 | Wilson | 712/207 |
| 5,951,674 A | * | 9/1999 | Moreno | 712/210 |
| 5,953,747 A | * | 9/1999 | Steely et al. | 711/204 |
| 5,958,048 A | * | 9/1999 | Babaian et al. | 712/241 |
| 5,966,737 A | * | 10/1999 | Steely et al. | 711/213 |

(Continued)

OTHER PUBLICATIONS

M. S. Lam, E. E. Rothberg, & M. E. Wolf, "The Cache Performance and Optimization of Blocked Algorithms"1993 ACM, pp. 63-74.*

*Primary Examiner* — Thai Phan
*Assistant Examiner* — Kibrom Gebresilassie
(74) *Attorney, Agent, or Firm* — Sawyer Law Group, P.C.

(57) ABSTRACT

A method of improved simulator processing is provided. The method according to the current invention includes grouping frequently accessed data into one set id to improve memory hierarchy performance. The method further includes simulating predication in a non-predicated architecture to improve CPU performance. The simulated predication includes pseudo-predicated implementation of read-operation vector element access pseudo-predicated implementation of write-operation vector element access, and predicated implementation of multi-way branches with assignment statements having a same left-hand-side (lhs). The method further includes determining a selection path in a multi-sensitive "always" block to reduce taken branches. The multi-sensitive "always" block selection path determination includes generating instance-specific code to save port allocation storage, and generating inlined instance-specific code to combine sensitive actions. The method further includes regenerating code affected by the assignment statement to implement value-change callback.

28 Claims, 3 Drawing Sheets

U.S. PATENT DOCUMENTS

| | | | | |
|---|---|---|---|---|
| 6,044,459 A * | 3/2000 | Bae et al. | | 712/237 |
| 6,047,358 A * | 4/2000 | Jacobs | | 711/133 |
| 6,047,359 A * | 4/2000 | Fouts | | 711/137 |
| 6,189,083 B1 * | 2/2001 | Snyder, II | | 711/213 |
| 6,205,544 B1 * | 3/2001 | Mills et al. | | 712/230 |
| 6,243,788 B1 * | 6/2001 | Franke et al. | | 711/3 |
| 6,263,428 B1 * | 7/2001 | Nonomura et al. | | 712/239 |
| 6,308,252 B1 * | 10/2001 | Agarwal et al. | | 712/22 |
| 6,321,295 B1 | 11/2001 | Vincent | | |
| 6,339,813 B1 * | 1/2002 | Smith et al. | | 711/144 |
| 6,412,057 B1 * | 6/2002 | Sasahara et al. | | 711/202 |
| 6,412,105 B1 * | 6/2002 | Maslennikov et al. | | 717/151 |
| 6,418,525 B1 * | 7/2002 | Charney et al. | | 711/213 |
| 6,490,654 B2 * | 12/2002 | Wickeraad et al. | | 711/133 |
| 6,539,522 B1 | 3/2003 | Devins et al. | | |
| 6,691,080 B1 * | 2/2004 | Tachibana | | 703/19 |
| 6,732,356 B1 * | 5/2004 | Chen | | 717/156 |
| 6,751,792 B1 * | 6/2004 | Nair | | 717/161 |
| 6,892,173 B1 * | 5/2005 | Gaither et al. | | 703/20 |
| 6,901,483 B2 * | 5/2005 | Robinson et al. | | 711/133 |
| 6,918,009 B1 * | 7/2005 | Sato et al. | | 711/137 |
| 6,944,853 B2 * | 9/2005 | Topham | | 717/158 |
| 6,983,361 B1 * | 1/2006 | Blandy | | 712/236 |
| 6,985,985 B2 * | 1/2006 | Moss | | 710/240 |
| 7,020,854 B2 | 3/2006 | Killian et al. | | |
| 7,080,365 B2 * | 7/2006 | Broughton et al. | | 717/146 |
| 7,100,164 B1 * | 8/2006 | Edwards | | 718/108 |
| 7,111,025 B2 * | 9/2006 | Finlay et al. | | 707/714 |
| 7,181,598 B2 * | 2/2007 | Jourdan et al. | | 712/217 |
| 7,234,040 B2 * | 6/2007 | Berg et al. | | 711/213 |
| 7,299,341 B2 * | 11/2007 | Lin | | 712/200 |
| 7,401,189 B2 * | 7/2008 | Bell et al. | | 711/140 |
| 7,590,830 B2 * | 9/2009 | Chaudhry et al. | | 712/239 |
| 7,617,362 B2 * | 11/2009 | Craft et al. | | 711/133 |
| 7,873,788 B1 * | 1/2011 | Moll et al. | | 711/133 |
| 7,966,315 B2 * | 6/2011 | Okamoto et al. | | 707/715 |
| 8,027,829 B2 * | 9/2011 | Mayer et al. | | 703/27 |
| 8,131,982 B2 * | 3/2012 | Emma et al. | | 712/225 |
| 8,205,200 B2 * | 6/2012 | Liao et al. | | 718/102 |
| 8,291,192 B2 * | 10/2012 | Ueno | | 711/173 |
| 2001/0037322 A1 * | 11/2001 | Lindsay et al. | | 707/1 |
| 2002/0091996 A1 * | 7/2002 | Topham | | 717/124 |
| 2002/0144092 A1 * | 10/2002 | Topham et al. | | 712/217 |
| 2003/0101335 A1 * | 5/2003 | Gillies et al. | | 712/234 |
| 2003/0182539 A1 * | 9/2003 | Kunkel et al. | | 712/225 |
| 2003/0188299 A1 * | 10/2003 | Broughton et al. | | 717/141 |
| 2003/0204834 A1 * | 10/2003 | Ball et al. | | 717/106 |
| 2004/0010501 A1 * | 1/2004 | Anderson et al. | | 707/100 |
| 2004/0044847 A1 * | 3/2004 | Ray et al. | | 711/122 |
| 2004/0083341 A1 * | 4/2004 | Robinson et al. | | 711/133 |
| 2004/0216095 A1 * | 10/2004 | Wu | | 717/151 |
| 2005/0034113 A1 * | 2/2005 | Gillies et al. | | 717/159 |
| 2005/0125785 A1 * | 6/2005 | Gillies et al. | | 717/159 |
| 2006/0074970 A1 * | 4/2006 | Narayanan et al. | | 707/102 |
| 2006/0200333 A1 * | 9/2006 | Dalal et al. | | 703/17 |
| 2007/0124732 A1 * | 5/2007 | Lia et al. | | 718/102 |
| 2007/0239975 A1 * | 10/2007 | Wang | | 712/241 |
| 2007/0294286 A1 * | 12/2007 | Werner et al. | | 707/102 |
| 2008/0209425 A1 * | 8/2008 | Ferris | | 718/102 |
| 2008/0228679 A1 * | 9/2008 | Ward | | 706/21 |
| 2008/0270773 A1 * | 10/2008 | Ziegler | | 712/235 |
| 2010/0318333 A1 * | 12/2010 | Hall | | 703/6 |

* cited by examiner

METHODS FOR IMPROVED SIMULATION OF INTEGRATED CIRCUIT DESIGNS

CROSS-REFERENCE TO RELATED APPLICATIONS

This application is cross-referenced to and claims the benefit from U.S. Provisional Patent Application 60/923,389 filed Apr. 12, 2007, which is hereby incorporated by reference.

FIELD OF THE INVENTION

The present invention relates generally to the design of integrated circuits. More specifically, it relates to improved techniques for simulating integrated circuit designs.

BACKGROUND

Application specific integrated circuits (ASIC) require testing and functional verification using simulators, prior to mask generation and chip fabrication. The steps followed today in the design of ASIC's are shown in the prior art flow diagram 100 of FIG. 1, where product specifications are written 102, and/or executable product specifications are written 104, for example in C/C++ programming language. The product specifications 102/104 are converted to register transfer level (RTL) descriptions 106, in a language such as Verilog or VHDL; generally referred to as hardware description language (HDL). Functional correctness 108 is performed for the RTL description 106 by writing tests and running them on an HDL-based RTL model (not shown). Once there is confidence in functional correctness, gate-level models 110 are built and timing verification 112 is performed. Once completed, the geometric description 114 is provided prior to the step of generating the mask and chip fabrication 116, both the gate level description 110 and geometric description 114 receive cell library information input 118 during the design phase. Functional verification 108 and timing verification 112 consume the vast majority of the engineering time (70% or more) needed to design an ASIC.

Simulators for HDLs run very slowly, for example a simulation model for a 200 MHz graphics chip might run at 100 Hz, a slowdown factor of 2 million. Further, simulating 1 second of the operation of such a graphics chip might take 2 million seconds, or about 2½ days.

In a simulator, a cache stores recently accessed memory locations in blocks of high-speed memory. FIG. 2 shows a prior art drawing of a block of high-speed memory called cache lines 200. Each line 200 has a tag 202 specifying a mapped memory address. Each cache consists of a set of <tag, cache_line> pairs, where the "cache_line" segment includes a set id 204 and a line index 206, that is the index of the cache_line 200. A set-associative cache partitions main memory into a number of regions, and assigns a separate cache to each region. Each location in each memory has an index, which is a unique number used to refer to that location. The index for a location in main memory is typically called an address. Each location in the cache has the tag 202, which contains the index of the datum in main memory that has been cached. A set of cache lines is selected using the set id bits 204 of the memory address, shown in FIG. 2.

Cache replacement policy decides where in the cache a copy of a particular entry of main memory will go. In a fully-associative cache, the replacement policy is free to choose any entry in the cache to hold the copy. Alternatively, if each entry in main memory can go in just one place in the cache, the cache is direct mapped. Many caches implement a compromise, and are described as set-associative. Associativity is a trade-off. If there are eight places the replacement policy can put a new cache entry, then when the cache is checked for a hit, all eight places must be searched. Checking more places takes more power, area, and potentially time. On the other hand, caches with more associativity suffer fewer misses, so less time is spent servicing those misses.

One of the advantages of a direct mapped cache is that it allows simple and fast speculation. Once the address has been computed, the one cache index, which might have a copy of that datum, is known. That cache entry can be read, and the processor can continue to work with that data before it finishes checking that the tag actually matches the requested address.

The idea of having the processor use the cached data before the tag match completes can be applied to associative caches as well. A subset of the tag, called a hint, can be used to pick just one of the possible cache entries mapping to the requested address. This datum can then be used in parallel with checking the full tag.

FIG. 3 shows a prior art set-associative cache diagram 300 illustrating the steps to check whether a memory address is "cached". Here, the line tags 302 of a cache set 304 corresponding to the memory address' set id 204 are compared against the memory address tag bits. If one of the line tags 302 match the address tag 202, the memory address is "cached": the data in the cache line 306 corresponding to the line tag 302 stores the cached data. Since accessing data in a cache line 306 is substantially faster than main memory access, overall processor performance improves. If a memory address is not found in cache, an unused data line in the selected cache set 304 is loaded with the memory address' contents, and the associated line tag 302 is set to the line address of the fetched memory. This action is known as cache-miss handling, and is relatively slow. However, subsequent accesses to the same memory address avoid going to main memory.

Working sets of large programs (e.g. multi-million-gate simulations) overflow processor caches, making the caches ineffective. State-of-the-art in software allocates memory addresses to program data without regard to how they map onto cache. Central data structures (e.g. those used by the scheduler of a simulator) compete for cache space with large user data that regularly spills the cache. Measurement of the execution cost of central routines (e.g. a scheduler) as a function of simulation size demonstrates that the execution cost rise dramatically.

Modern microprocessors that execute instruction in stages to execute an instruction $I_n$ is called a pipeline. There is usually more than one type of pipeline in a microprocessor. For example, the pipeline used to execute a "floating-point add" is different from the one used to execute a conditional branch instruction. The number stages in each pipeline can also vary. For a microprocessor using its average pipeline depth D, instructions move from one stage the next in a fixed amount of time, represented by a clock period. The clock period of a modern microprocessor is often under 1 nanosecond. The reciprocal of the clock period determines a processor's operating frequency, for example a 3 GHz microprocessor moves instructions between stages every 0.33 nanoseconds. In addition to pipelining instructions, modern microprocessors execute several consecutive instructions in parallel. For example, a modern family of microprocessors issues up to 4 instructions in parallel using pipelines whose average depth D is 14 stages.

The result of executing an instruction $I_n$ can be needed by subsequent instructions $I_j$ (where j>n). If an instruction $I_n$ begins to execute at clock period c, it will not be finished executing, on the average, until clock period c+D, where D the processor's pipeline depth. If instruction $I_{(n+1)}$ uses the result of instruction $I_n$, but starts to execute at clock period c+1, it has to wait as long as D−1 clock periods before the result is available. The stage of instruction $I_{(n+1)}$ that needs the result of instruction $I_n$ is usually not the first stage; so the latency need not be for D−1 clock periods. Since such inter-instruction dependencies are common, microprocessors issue instructions to execution pipelines on a speculative basis. For example, consider the code

```
ADD 1, var       // I1: var = var + 1
CMP 17, var      // I2: var == 17 ?
JE var_is_17     // I3: if var == 17 goto instruction at label var_is_17
ADD 2, var       // I4: if var != 17 var = var + 2
: ... more code
var_is_17:
   MOV 0, var // var = 0
```

In a scenario where ADD and CMP (compare) instructions enter the first stage of the execution pipe at a clock period 5, and that the conditional control transfer JE (jump if equal) enters the execution pipe's first stage at clock period 6. By the time the JE instruction is ready to fetch conditionally the instruction at label var_is_17, it is very likely that the results of the CMP instruction, and possibly even the ADD are not ready. Rather than wait for the instructions to complete, the JE instruction makes a guess, or predicts, whether or not the branch will be taken. If the prediction is correct, a lot of waiting is avoided. However, if the prediction is incorrect, all of the instructions being executed in the mispredicted path need to be discarded. Backtracking in this manner is very expensive. Because of the high cost of mispredicted conditional branches, modern microprocessors expend a lot of logic to implement good prediction algorithms. These algorithms all look at the past behavior of a branch, perhaps in the context of other temporally precedent branches, to predict the behavior of the current branch.

Accordingly, there is a need to develop a method to allow simulators to run faster by improving cache utilization, predication methods, and block selection path determination methods.

SUMMARY OF THE INVENTION

To overcome the current teachings in the art, a method of improved simulator processing is provided. The method according to the current invention includes grouping frequently accessed data into one set id to improve memory hierarchy performance. The method further includes simulating predication in a non-predicated architecture to improve CPU performance. The simulated predication includes pseudo-predicated implementation of read-operation vector element access pseudo-predicated implementation of write-operation vector element access, and predicated implementation of multi-way branches with assignment statements having a same left-hand-side (lhs). The method further includes determining a selection path in a multi-sensitive "always" block. The multi-sensitive "always" block selection path determination includes generating instance-specific code to save port allocation storage, and generating inlined instance-specific code to combine sensitive actions. The method further includes regenerating code affected by the assignment statement to implement value-change callback.

In one aspect of the invention, the data used by a simulation scheduler is allocated by providing a processor cache for probing a line size of the cache, providing a software override of a value of the probed line size, selecting a core routine algorithm and/or data structure for the scheduler such that a sum of line sizes having the value of most frequently used data structure is no more than a d1_linesize, where d1_linesize is the line size of the level 1 data cache. In a further aspect, a start address of the data structures is aligned to an address that is a multiple of the d1_linesize, whereby the data structures are ensured occupy a minimum number of sets of the data cache.

In another aspect of the invention, a user specifies a set id of a class of central routines as either a fixed value between a range of 0 and S−1 inclusive, or as a randomly chosen value in the range.

In a further aspect of the invention, the method further includes applying programming constructs that are unique to hardware description language (HDL), where the predication in the non-predicated architectures is simulated.

In yet another aspect of the invention, target machine microarchitecture characteristics are measured, where a maximum pseudo-predicated instruction sequence length is determined, and the measure may be overridden by a compiler-user-specified parameter.

In a further aspect, a first phantom element at index −1 of each vector is introduced, where the element is initialized to a variable and a pseudo-predicated evaluation of the vector is enabled.

In another aspect of the invention, a second phantom element at index −2 of each vector is introduced, such that when the vector has X/Z bits the −2 index is a temporary storage location.

In another aspect of the invention, if there is no "else"/ "default" clause and a number of terms in a multi-way branch are below a programmable threshold, a value of expr_else is set to lhs, whereby statements of the multi-way branch are converted to allow for the predication.

In yet another aspect of the invention, statements without an "else" clause are not converted to predicated form such that when inlining the "always" block, triggering of the "always" block is tracked.

In one aspect, code is inlined for each instance of a small module such that a need for per-point pointer is obviated, and a module of each the inlined code can directly encode an actual parameter address.

In one aspect all the instances of a module are viewed at compile time, whereby a chain of actions triggered by an assignment is inlined without consideration of instance boundaries, whereas as long as a number of machine instructions in the inline sequence is less than a parameter value.

In a further aspect, a presence of X/Z bits are checked, where, if the X/Z bits are present a separate code area is branched to for handling.

In another aspect of the invention, condition checks are done only by mainline code, where code for statement bodies for each condition is stored in a separate code area. Further, nesting of condition checks is provided, where the nesting is of the separate code area.

In a further aspect of the invention, when the regenerated code for an assignment that is affected by a temporal call to an acc_vcl_add( ) command then the acc_vcl_add( ) command is executed.

In another aspect, the invention further comprises assigning a unique id to each format specifier. In this aspect, an I/O command only sends the format specifier id and data values to an I/O subsystem. In this embodiment, the I/O subsystem runs on a separate processor/thread to offload a main simulation processor.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Figure 1:
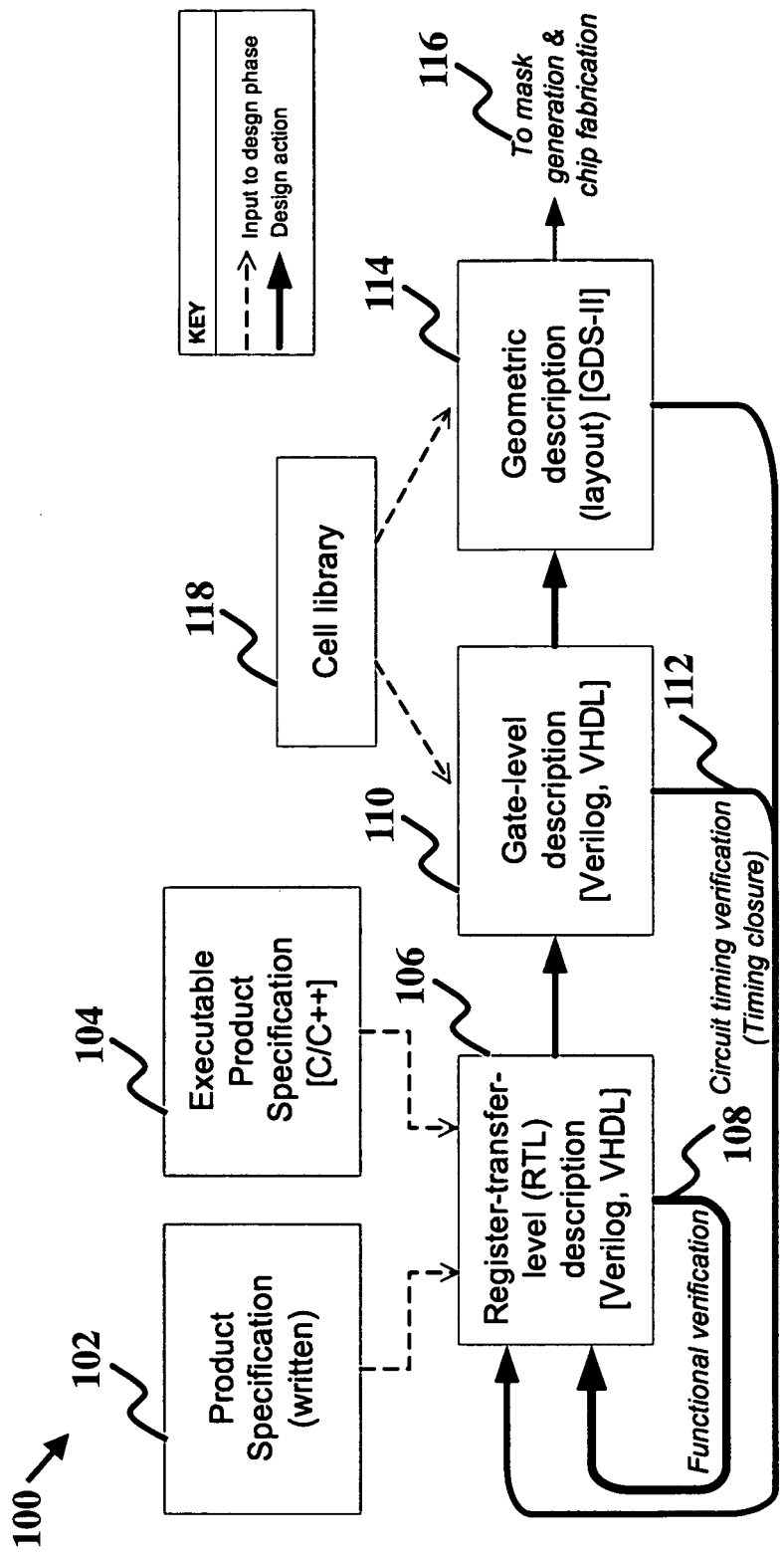
FIG. 1 shows a flow diagram of the prior art steps in the design of ASIC's.
Figure 2:
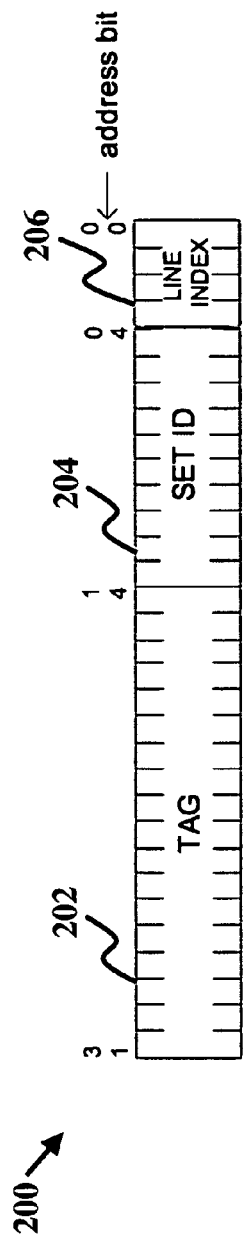
FIG. 2 shows a prior art drawing of a block of high-speed memory cache lines.
Figure 3:
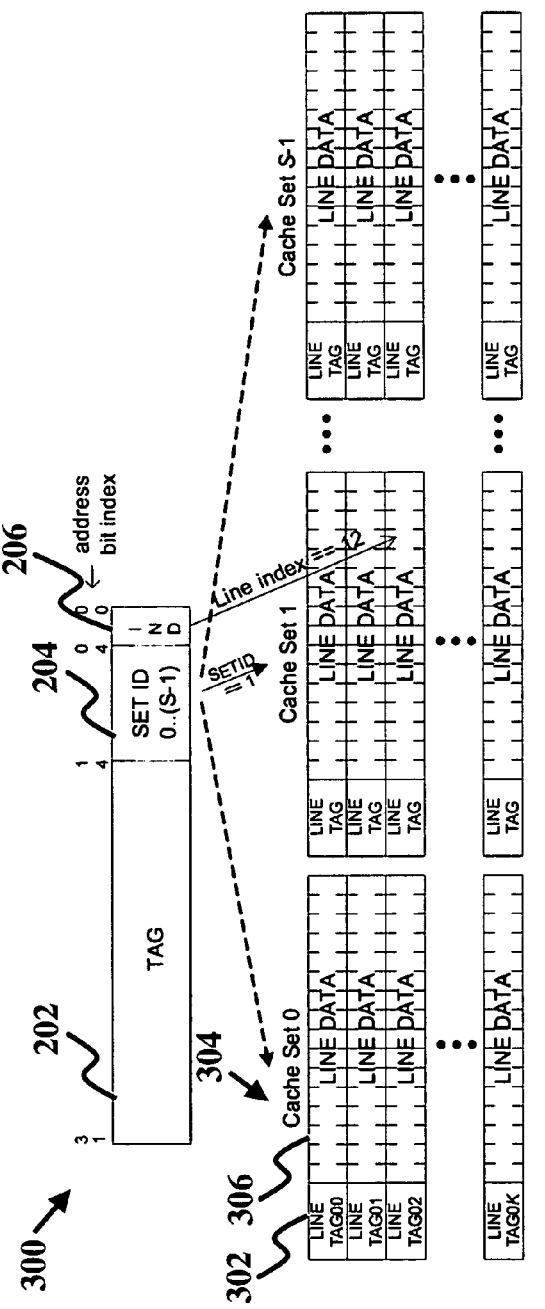
FIG. 3 shows a prior art set-associative cache diagram of the steps to check whether a memory address is cached.

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The current invention improves memory hierarchy performance by grouping frequently accessed data into one set id. The working set of large programs, for example multi-million-gate simulations, overflows processor caches and makes the caches ineffective. Current software techniques allocate memory addresses to program data without regard to how they map onto the cache, causing central data structures, for example those used by the scheduler of a simulator, compete for cache space with large user data that regularly spills the cache. Measurements of the execution cost of central routines, such as a scheduler, as a function of simulation size causes the execution cost to rise dramatically.

The current invention allocates data used by a particular class of central routines, such as a scheduler by probing the line size of the target processor's level-1 D-cache (call it d1_linesize), where a software override for the probed value is also provided. The current invention selects the core routine's algorithm and/or data structures, such as a scheduler, so that the sum of the sizes of the most frequently used data structures is no more than d1_linesize. According to the current invention, to ensure that data structures mentioned above do not stride a level-1 D-cache line, the start address of the data structures is aligned at an address that is a multiple of d1_linesize. In addition to grouping the data structures for a particular class of central routines into a level-1 D-cache line, the set id of the memory addresses are also allowed to be set in the range 0 to S−1 by some method. For example, the user is allowed to specify the set id of each class of central routines as either a fixed value between 0 and S−1 inclusive, or as a randomly chosen value in the same range.

The current invention improves CPU performance by simulating predication in a non-predicated architecture. The deep pipelines of modern microprocessors result in many instructions in-flight simultaneously, for example up to 120 instructions can be in-flight in a modern microprocessor. All in-flight instructions are discarded on a branch mispredict. The need to avoid mispredicted branches is well known. A commonly accepted way of avoiding branches altogether is the use of predication. Predication has been built into the instruction set of some newer microprocessor architectures. Avoiding branches has been invoked in simple expressions such as $X=(A<B)?\text{CONST1}:\text{CONST2}.$ The current invention simulates predication in non-predicated architectures, for example the 80x86, by applying the technique to programming constructs unique to hardware description languages (HDL). As an example, Verilog the semantics of assignments to vector elements includes:

```
expr = v[index]
v[index] = expr
```

As a further example, a multi-part "if . . . then . . . else" statement or a "case . . . endcase" statement, with each part containing only an assignment statement "lvalue$_i$=rvalue$_i$," such that all lvalue$_i$ are the same. Such constructs are not implemented using pseudo-predication in state-of-the art compilers.

The simulation of predication on non-predicated architectures like the 80x86 is termed pseudo-predication according to the current invention. The current invention determines maximum pseudo-predicated instruction sequence length by considering target machine microarchitecture characteristics, such as the average number of in-flight instructions. Further, the current invention allows this measure to be overridden by a compiler-user-specified parameter.

The current invention provides pseudo-predicated implementation of vector element access for a read operation. Verilog semantics of the read of element index_expr of the vector v in an expression like lhs=v[index_expr] states that the value of v[index_expr] should be X (i.e. "unknown") if index_expr itself has any X or Z (i.e. "high-impedance") bits in it. An obvious implementation is:

```
if ( has_XZ(index_expr) )
    lhs = 'hX;
else
    lhs = v[index_expr];
``` but this requires conditional branches, which are subject to misprediction.

Figure 4:
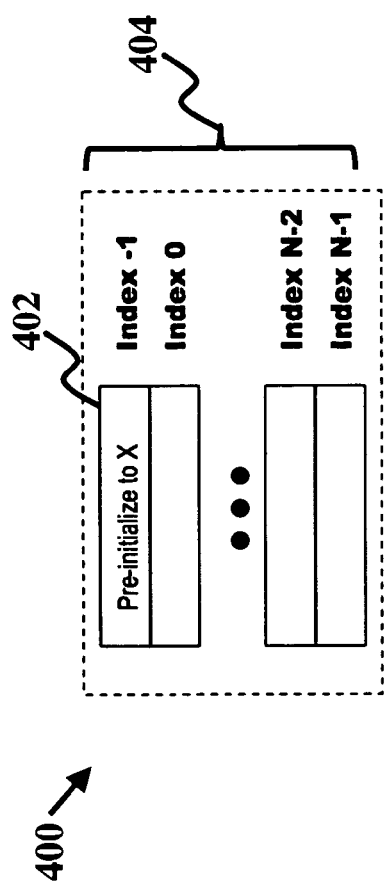
FIG. 4 shows a first diagram of a vector set of elements according to the present invention.

FIG. 4 shows a first diagram of a vector set of elements 400, according to the current invention. The current invention introduces a phantom element 402 at a unique index (e.g. −1) of every vector 400, and initializes the element 402 to X. This allows the implementation:

```
tmp_reg = has_XZ(index_expr) ? −1 :
    index_expr;
lhs = v[tmp_reg];
```

According to the current invention, introduction of the phantom index permits the pseudo-predicated evaluation of vector index 404.

The current invention provides pseudo-predicated implementation of vector element access for a write operation. Verilog semantics the write of element index_expr of the vector v in an expression like v[index_expr]=rhs_expr states that no store should occur to v if index_expr itself has any X (i.e. "unknown") or Z (i.e. "high impedance") bits in it. An obvious implementation is:

```
if ( !has_XZ(index_expr) )
    v[index_expr] = rhs_expr;
``` but this requires conditional branches (which are subject to misprediction).

Figure 5:
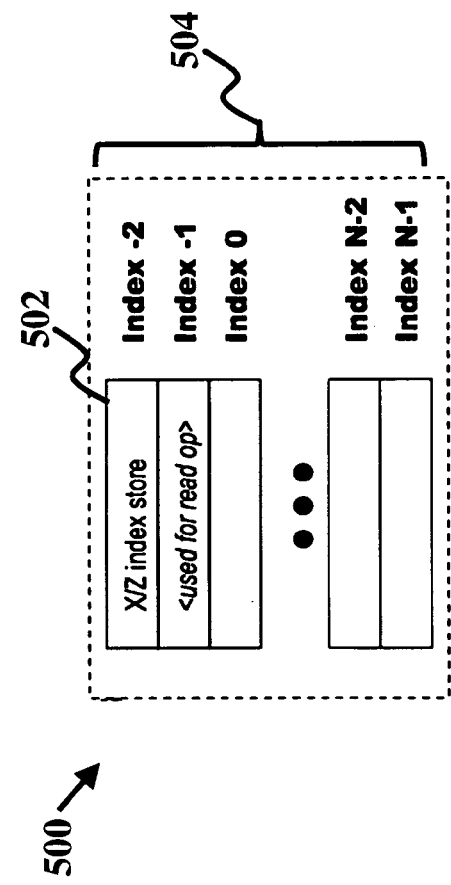
FIG. 5 shows a second diagram of a vector set of elements according to the present invention.

FIG. 5 shows a second diagram of a vector set of elements 500. The current invention introduces a phantom element 502 at a unique index (e.g. −2) of every vector 500, using it as a "junk" storage location when the index 504 has X/Z bits. This allows the implementation:

```
tmp_reg = has_XZ(index_expr) ? −2 : index_expr;
v[tmp_reg] = rhs_expr;
```

According to the current invention, introducing the phantom index permits the pseudo-predicated evaluation of vector index 504.

The current invention provides predicated implementation of multi-way branches with an assignment statement having the same left-hand-side.

The following example is provided of a prior art multi-way branch statement of the form:

```
if ( cond1 )
    lhs = expr1;
else if ( cond2 )
    lhs = expr2;
...
else
    lhs = expr_else;
or
case ( case_expr )
C1: lhs = expr1;
C2: lhs = expr2;
...
default:
    lhs = expr_else;
``` this multi-way branch statement is converted, as shown below, by the methods of the current invention, to allow for predication.

```
lhs = cond1 ?? expr1 :
      cond2 ?? expr2 :
      ...
      expr_else;
lhs = case_expr===C1 ?? expr1 :
      case_expr===C2 ?? expr2 :
      ...
      expr_else;
```

Accordingly, if there is no "else"/"default" clause, and the number of terms in the multi-way branch is below a programmable threshold, the value of expr_else is set to lhs. Otherwise, statements without else clauses are not converted to predicated form.

The current invention reduces taken branches by determining the selection path in a multi-sensitive "always" block. A common coding style in HDLs, for example Verilog, is always @(reset or clock) begin

```
if ( reset )
    my_reg = 0;
else begin
    my_reg = your_reg & 'hAB0;
    your_reg = 0; // etc.
end
```

Here, the activation of the reset command is infrequent, yet the code requires jumping around (or predicating through) the reset block. According to the invention, when inlining this "always" block, the current invention tracks the sensitive assignment that triggered this "always" block. If the assignment variable is not present in the condition expression of the top-level "if . . . else", the corresponding if branch body is considered unlikely to execute.

The current invention further provides reduction of taken branches by determining the selection path in a multi-sensitive "always" block. As an example, clock=0 generates the sensitive inline sequence:

```
if ( reset ) goto <unlikely reset code>
// else begin
my_reg = your_reg & 'hAB0;
your_reg = 0; // etc.
// end
```

However, reset=0 generates the sensitive inline sequence

```
if ( !reset ) goto <unlikely !reset code>
my_reg = 0;
```

The current invention saves port allocation storage by generating instance-specific code. The discrepancy between access times of on-chip caches and off-chip memory makes high-data cache utilization a critical code generation objective. Each port declaration in a module requires a pointer allocation per port to point at an actual parameter. This is a particular issue for very small modules that have many ports. The current invention inlines the code for each instance of a small module. This method obviates the need for a per-port pointer, since each inlined module can encode the actual parameter address directly.

The current invention combines sensitive actions by generating inlined, instance-specific code. Static scheduling of actions that are triggered by, or are sensitive to, an assignment is key to increasing simulation performance. For example:

```
always @(negedge clk) count = count + 1;
clk = 0;
``` generates code equivalent to

```
clk = 0;
count = count+1;
```

If clk is bound to a port in one or more module instances, a subroutine has to be called in the module's code to process sensitivities to clk within the module. This approach is expensive because the assignment may not activated within the module instance, and this fact may be determinable statically; e.g. if a submodule only has "always @(posedge clk)" references, the "clk=0" reference will never trigger in the submodule the subroutine call/call return needed is expensive in terms of CPU time. This is especially so since module instance triggered by the "clk=0" assignment may in turn trigger a chain of nested actions.

The current invention looks at all module instances at compile time, and inlines the chain of actions triggered by an assignment, without regard to instance boundaries. This is done as long as the number of machine instructions in the inline sequence is less than a parameter value.

Packed 4-value data representation reduces execution cost and improves cache utilization. Here, data is packed in a way that is compatible with target architecture's registers 1 to 4 bits: 1 byte
5 to 8 bits: 2 bytes
9 to 16 bits: 4 bytes
17 to 32 bits: 8 bytes Encoding mode and value bits simultaneously often saves instructions such as to compute conditional var==2, or to compute bitwise operations (a|b, a&b, ... ). Encoding mode and value bits simultaneously maximizes use of scarce register resources.

Compacting data items in a module improves cache utilization. For example, compacting using a scheme that sorts data items in a module according to decreasing size, or a scheme that further allocates memory according to "natural" boundaries, but only up to min(bus_width, reg_size) of the simulation target processor, where bus_width is the number of data bits fetched from memory in a single clock, and reg_size is the maximum number of bits in a general register of the processor. Note that the allocation scheme permits the bus_width value to be specified as a compiler flag. This scheme maximizes cache utilization by reordering data to improve packing. However, it avoids the problem of "split bus transactions" by aligning at least up to the width of a memory bus transfer. Some examples include:

1 bit to 4 bits occupy a byte-aligned address
5 bits to 8 bits occupy a 2-byte-aligned address
9 bits to 16 bits occupy a 4-byte-aligned address
17 bits to 32 bits occupy a 4-byte-aligned address if reg_size is 32, or an 8-byte-aligned address if reg_size is 64
33 bits to 64 bits occupy an 8-byte-aligned address is reg_size is 64 or if bus_width is 64-bits
65 bits to 128 bits occupy an 8-byte-aligned address if reg_size is 64, or a 16-byte-aligned address if reg_size is 128 and bus_width>=128.

Affinity-based code grouping improves cache utilization and reduces control hazards. Not all code related to an algorithm is equally likely to execute, such as in Verilog:

X/Z processing for 4-valued arithmetic operations is unlikely.

The current invention checks for X/Z bits and if present, branches to a separate code area to handle.

Multi-way code branching; e.g. in a multi-branched if ... if-else ... statement, or in most case statements in Verilog, several conditional expressions are evaluated, but only of the conditions is true.

According to the current invention, mainline code only does condition checks. Code for the statement bodies for each condition is stored in a separate code area. Since statements can be nested, for example the body of an if ... if-else ... statement can itself contain an if ... if-else ..., the current invention allows nesting of the separate code area. According to the current invention, the possibly nested series of separate code areas are called shove areas. The current invention keeps code that is expected to execute sequentially in a single code area, and moves expected non-sequential code to a separate shove area to reduce taken branches, and improve the efficiency of instruction prefetchers present in modern microprocessors.

The current invention implements a value-change callback by regenerating code. Value-change callback is a Verilog feature that allows a foreign language such as C/C++ to register a callback at runtime. Callback is activated whenever a value change occurs during simulation, a fundamental of a Verilog PLI routine acc_vcl_add( ). Since the Verilog object being monitored is not known prior to the simulation run, every Verilog object needs to be monitored. Monitoring every object is prohibitively expensive and state-of-the-art Verilog compilers require the user to specify list of objects that need monitoring. The current invention provides a method of regenerating the code for assignment statements affected by a call to acc_vcl_add( ) at the time the acc_vcl_add( ) is executed, which is optimum in the context of a dynamic code-generation platform according to the current invention. Since many acc_vcl_add( ) calls can be made in a single PLI routine, code regeneration is best deferred to the point where the PLI routine exits.

The current invention provides a method of compressing and improving throughput of formatted I/O in Verilog. Simulations often result in many gigabytes of generated data, for example, in Verilog, using $display( ), or the io_printf( ) call. Formatting $display( ) and io_printf( ) text is time consuming. Storage size and network/DASD traffic are real performance issues, especially when used in arrays of simulators or "simulation farms." Instead of compressing formatted data, the current invention assigns a unique id to each format specifier. The I/O command only sends format specifier id and data values to I/O subsystem optionally, I/O subsystem runs on a separate processor/thread to offload main simulation processor.

The present invention has now been described in accordance with several exemplary embodiments using the hardware description language (HDL) called Verilog, which are intended to be illustrative in all aspects, rather than restrictive. Thus, the present invention is capable of many variations in detailed implementation, which may be derived from the description contained herein by a person of ordinary skill in the art. For example, the same scenarios are applicable to the hardware description language VHDL and SystemVerilog, as well as the modeling language System C.

All such variations are considered to be within the scope and spirit of the present invention as defined by the following claims and their legal equivalents.

What is claimed:

1. A computer-implemented method of improving simulator processing, the method comprising:
    allocating data used by a simulation scheduler;
    simulating predication in a non-predicated architecture, wherein the simulated predication comprises:
        determination of a maximum pseudo-predicated instruction sequence length by considering target machine microarchitecture characteristics;
        implementation of multi-valued read-operation and multi-valued write-operation vector element access, wherein any of the multi-value read-operation and the multi-valued write-operation can be expressed as 0/1/X/Z bits; and
        implementation of multi-way branches with assignment statements having a same left-hand-side (lhs);
    determining a selection path in a multi-sensitive "always" block to reduce taken multi-way branches, and generating code;
wherein allocating data used by a simulation scheduler further comprises:
probing a line size of a processor cache;
providing a software override of a value of the probed line size; and
selecting one or more of a core routine algorithm and data structure for the simulation scheduler, wherein a sum of line sizes is not greater than a d1_linesize, wherein the d1_linesize is a line size of a level 1 data cache.

2. The computer-implemented method of claim 1, wherein a start address of the data structure is aligned at an address that is a multiple of the d1_linesize.

3. The computer-implemented method of claim 1, wherein a user specifies a set id of a class of central routines (S) as either a fixed value between a range of 0 and S−1 inclusive, or as a randomly chosen value in the range of 0 and S−1.

4. The computer-implemented method of claim 1, further comprising:
applying programming constructs, wherein the programming constructs are unique to hardware description language (HDL).

5. The computer-implemented method of claim 1, wherein target machine microarchitecture characteristics are measured and the maximum pseudo-predicated instruction sequence length is determined, wherein a compiler-user-specified parameter can override the measured characteristics.

6. The computer-implemented method of claim 1, wherein a first phantom element at index −1 of each vector is introduced to conduct a pseudo-predicated evaluation of each vector.

7. The computer-implemented method of claim 1, wherein a second phantom element at index −2 of each vector is introduced and when the vector has X/Z bits the −2 index is a temporary storage location.

8. The computer-implemented method of claim 1, wherein assignment statements of the multi-way branch are converted to allow for the predication in a non-predicated architecture.

9. The computer-implemented method of claim 8, wherein assignment statements of the multi-way branch only having an "else" clause are converted to allow for the predication in a non-predicated architecture.

10. The computer-implemented method of claim 1, wherein code is inlined for each instance of a small module that directly encodes an actual parameter address.

11. The computer-implemented method of claim 10, wherein the module is viewed at compile time.

12. The computer-implemented method of claim 1, wherein if X/Z bits are present, a separate code area is branched for handling.

13. The computer-implemented method of claim 1, wherein condition checks are done only by mainline code, whereas code for statement bodies for each condition is stored in a separate code area.

14. The computer-implemented method of claim 13, wherein nesting of the separate code area is provided.

15. The computer-implemented method of claim 1, wherein an acc_vcl_add( ) command is executed when the generated code for an assignment is affected by a temporal call.

16. The computer-implemented method of claim 1, further comprising:
assigning a unique id to each one of a format specifier.

17. The computer-implemented method of claim 16, wherein an I/O command only sends the format specifier id and data values to an I/O subsystem.

18. The computer-implemented method of claim 17, wherein the I/O subsystem runs on a separate processor/thread to offload a main simulation processor.

19. A system comprising:
a memory; and
a processor configured to:
simulate predication in a non-predicated architecture, wherein the simulated predication comprises:
determination of a maximum pseudo-predicated instruction sequence length by considering target machine microarchitecture characteristics;
implementation of multi-valued read-operation and multi-valued write-operation vector element access, wherein any of the multi-valued read-operation and multi-valued write-operation can be expressed as 0/1/X/Z bits;
implementation of multi-way branches with assignment statements having a same left-hand-side (lhs);
and determining a selection path in a multi-sensitive "always" block to reduce taken multi-way branches,
and generating code;
wherein to allocate data used by a simulation scheduler further comprises to:
probe a line size of a processor cache;
provide a software override of a value of the probed line size; and
select one or more of a core routine algorithm and data structure for the simulation scheduler, wherein a sum of line sizes is not greater than a d1_linesize, wherein the d1_linesize is a line size of a level 1 data cache.

20. The system of claim 19, wherein the processor is further configured to:
apply programming constructs, wherein the programming constructs are unique to hardware description language (HDL).

21. The system of claim 19, wherein a start address of the data structure is aligned at an address that is a multiple of the d1_linesize.

22. The system of claim 19, wherein a user specifies a set id of a class of central routines (S) as either a fixed value between a range of 0 and S−1 inclusive, or as a randomly chosen value in the range of 0 and S−1.

23. The system of claim 19, wherein target machine microarchitecture characteristics are measured and the maximum pseudo-predicated instruction sequence length is determined, wherein a compiler-user-specified parameter can override the measured characteristics.

24. A non-transitory computer readable storage medium containing program instructions for improving simulator processing, wherein execution of program instructions by one or more processors of a computer causes the one or more processors to carry out the steps of:
simulating predication in a non-predicated architecture, wherein the simulated predication comprises:
determination of a maximum pseudo-predicated instruction sequence length by considering target machine microarchitecture characteristics;
implementation of multi-valued read-operation and multi-valued write-operation vector element access, wherein any of the multi-valued read-operation and multi-valued write-operation can be expressed as 0/1/X/Z bits;
implementation of multi-way branches with assignment statements having a same left-hand-side (lhs);

determining a selection path in a multi-sensitive "always" block to reduce taken multi-way branches, and
generating code;
wherein allocating data used by a simulation scheduler further comprises:
probing a line size of a processor cache;
providing a software override of a value of the probed line size; and
selecting one or more of a core routine algorithm and data structure for the simulation scheduler, wherein a sum of line sizes is not greater than a d1_linesize, wherein the d1_linesize is a line size of a level 1 data cache.

25. The non-transitory computer readable storage medium of claim 24, further comprising:
applying programming constructs, wherein the programming constructs are unique to hardware description language (HDL).

26. The non-transitory computer readable storage medium of claim 24, wherein a start address of the data structure is aligned at an address that is a multiple of the d1_linesize.

27. The non-transitory computer readable storage medium of claim 24, wherein a user specifies a set id of a class of central routines (S) as either a fixed value between a range of 0 and S−1 inclusive, or as a randomly chosen value in the range of 0 and S−1.

28. The non-transitory computer readable storage medium of claim 24, wherein target machine microarchitecture characteristics are measured and the maximum pseudo-predicated instruction sequence length is determined, wherein a compiler-user-specified parameter can override the measured characteristics.

* * * * *